(12) United States Patent
Chen et al.

(10) Patent No.: US 9,702,248 B2
(45) Date of Patent: Jul. 11, 2017

(54) OPTICAL FLUID MODEL BASE CONSTRUCTION AND USE

(71) Applicant: Halliburton Energy Services, Inc., Houston, TX (US)

(72) Inventors: Dingding Chen, Tomball, TX (US); Christopher Michael Jones, Houston, TX (US); David L. Perkins, The Woodlands, TX (US); Jing Shen, Houston, TX (US); Li Gao, Katy, TX (US); Michael T. Pelletier, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 58 days.

(21) Appl. No.: 14/436,017

(22) PCT Filed: Jan. 27, 2014

(86) PCT No.: PCT/US2014/013192
§ 371 (c)(1),
(2) Date: Apr. 15, 2015

(87) PCT Pub. No.: WO2015/112177
PCT Pub. Date: Jul. 30, 2015

(65) Prior Publication Data
US 2016/0273354 A1    Sep. 22, 2016

(51) Int. Cl.
*G01N 31/00* (2006.01)
*E21B 49/08* (2006.01)
(Continued)

(52) U.S. Cl.
CPC ............ *E21B 49/08* (2013.01); *E21B 47/102* (2013.01); *G06F 17/5009* (2013.01);
(Continued)

(58) Field of Classification Search
CPC .......................... E21B 49/10; G01N 33/2823
See application file for complete search history.

(56) References Cited

U.S. PATENT DOCUMENTS

| 6,178,815 B1 * | 1/2001 | Felling | E21B 49/10 |
| | | | 166/250.07 |
| 6,995,360 B2 * | 2/2006 | Jones | B08B 7/028 |
| | | | 250/269.1 |

(Continued)

FOREIGN PATENT DOCUMENTS

| WO | WO-0184122 A2 | 11/2001 |
| WO | WO-2009/025688 A1 | 2/2009 |

(Continued)

OTHER PUBLICATIONS

"European Application Serial No. 14816091.4, Extended European Search Report mailed Jun. 13, 2016", 7 pgs.

(Continued)

*Primary Examiner* — Elias Desta
(74) *Attorney, Agent, or Firm* — Gilliam IP PLLC

(57) ABSTRACT

Apparatus, systems, and methods may operate to select a subset of sensor responses as inputs to each of a plurality of pre-calibrated models in predicting each of a plurality of formation fluid properties. The sensor responses are obtained and pre-processed from a downhole measurement tool. Each of the plurality of predicted formation fluid properties are evaluated by applying constraints in hydrocarbon concentrations, geo-physics, and/or petro-physics. The selection of sensor responses and the associated models from a pre-constructed model base or a candidate pool are adjusted and reprocessed to validate model selection.

24 Claims, 9 Drawing Sheets

(51) Int. Cl.
*E21B 47/10* (2012.01)
*G06F 17/50* (2006.01)
*G06N 3/04* (2006.01)
*G06N 3/08* (2006.01)
*G06N 3/12* (2006.01)
*E21B 49/00* (2006.01)

(52) U.S. Cl.
CPC ............. *G06N 3/0481* (2013.01); *G06N 3/08* (2013.01); *E21B 49/003* (2013.01); *E21B 2049/085* (2013.01); *G06N 3/126* (2013.01)

(56) References Cited

U.S. PATENT DOCUMENTS

| | | | |
|---|---|---|---|
| 7,938,175 B2* | 5/2011 | Skinner | E21B 7/15 166/250.16 |
| 2006/0226699 A1 | 10/2006 | Betancourt et al. | |
| 2008/0034025 A1 | 2/2008 | Zubkov et al. | |
| 2009/0150079 A1 | 6/2009 | Hsu et al. | |
| 2011/0042071 A1 | 2/2011 | Hsu et al. | |
| 2013/0085674 A1 | 4/2013 | Zhdaneev et al. | |
| 2013/0312481 A1 | 11/2013 | Pelletier et al. | |
| 2014/0309959 A1 | 10/2014 | Shen et al. | |
| 2016/0032719 A1 | 2/2016 | Chen et al. | |

FOREIGN PATENT DOCUMENTS

| | | | |
|---|---|---|---|
| WO | WO-2013089764 A1 | 6/2013 | |
| WO | WO-2015/112177 A1 | 7/2015 | |

OTHER PUBLICATIONS

Erisken, Kare Otto, et al., "Field Tests of a New Optical Sensor Based on Intrgrated Computational Elements for Downhole Fluid Analysis", *SPE-166415-MS, SPE Annual Technical Conference and Exhibition*, vol. 5, Sep. 30,-Oct. 2, 2013, New Orleans, LA,, USA, (2013), 1-13.

Jones, Christopher, et al., "Field Test of the Integrated Computational Elements: A New Optical Sensor for Downhole Fluid Analysis", *SPWLA 54th Annual Logging Symposium*, Jun. 22-26, 2013, (2013), 1-10.

"International Application Serial No. PCT/US2014/013192, International Search Report mailed Oct. 29, 2014", 3 pgs.

"International Application Serial No. PCT/US2014/013192, Written Opinion mailed Oct. 29, 2014", 4 pgs.

"European Application Serial No. 14816091.4, Response filed Sep. 28, 2016 to Extended European Search Report mailed Jun. 13, 2016", 14 pgs.

* cited by examiner

OPTICAL FLUID MODEL BASE CONSTRUCTION AND USE

PRIORITY APPLICATIONS

This application is a U.S. National Stage Filing under 35 U.S.C. 371 from International Application No. PCT/US2014/013192, filed on 27 Jan. 2014, which application is incorporated herein by reference in its entirety.

BACKGROUND

Spectroscopic analysis makes use of a change in the properties of energy, such as light, after it interacts with a material sample. For example, the property of light most often correlated to a property of the sample is the intensity of the light. According to the Beer-Lambert law, the intensity of light transmitted through a fluid sample varies exponentially with respect to the absorptivity of the sample (usually expressed as molar absorptivity or molecular absorptivity), the path length through which the light is transmitted, and the concentration of the absorbing species in the sample.

Spectroscopic analysis of formation fluid can be performed downhole using a downhole tool to estimate the fluid's compositional concentrations as well as other fluid properties. The analysis of fluid compositional concentrations can be at least self-consistent.

Methods for optical fluid identification can apply diverse predictive models to evaluate different fluid properties of interest. Each model is typically calibrated on selected fluid samples from a standard fluid library under stabilized conditions using a number of predetermined parameters as model inputs that may have been derived from, or simulated with, particular detector outputs of an optical sensor. Data prediction using standard calibration inputs is usually accurate on training samples utilized for model development. However, problems in predicting formation fluid composition can arise due to field data being out of calibration data range, optical signal intensity variation with severe environment and tool conditioning, and one or more optical elements that fail to operate properly.

DETAILED DESCRIPTION

Figure 1:
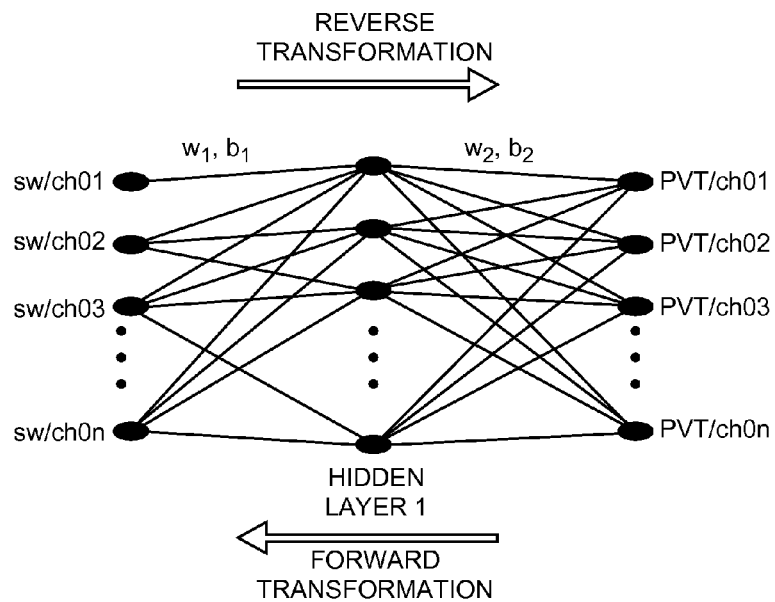
FIG. 1 illustrates an embodiment of a general transformation model framework with a multi-input, multi-output neural network.

As noted above, the difficulty of performing spectroscopic analysis may be compounded when such is attempted in a downhole environment with predictive models, especially if the measurements obtained from the tool and the data used for model calibration are scaled with different disciplines. As a solution method, the measured optical sensor response from formation fluid sampling and testing can be converted to a compatible parameter response in the calibration database through a transformation or standardization algorithm before the data are fed into fluid identification models. In one practice, optical responses used as calibration inputs for developing data transformation algorithm are measured from the sensor wheel before the tool is manufactured, assuming that the signal variation in each optical channel is less significant after the tool is assembled. When the assumption becomes invalid, the uncertainty associated with instrument standardization can have an impact on the prediction of fluid properties which makes the input selection more challenging during the early phase of predictive model development.

Moreover, the samples in a standard fluid library used for model development may be updated over time and the light responses of optical elements may vary with different designs and fabrications. Using the same input parameters for a given sensor, a model calibrated on a particular data set may produce predictions different from that provided by a model calibrated with an extended or reduced data set. Similarly, predictions that agree may be generated with models calibrated on the same fluid samples with different optical inputs of sensors. In general, the "best" model selected as the default setting may have limitations when applied to the field data with multisource-induced uncertainty. Real-time adaptive model selection or post-processing the data with other relevant models is often used to refine the prediction.

To address these challenges, and others, as well as to retain the effort expended on optical sensor and model development, an optical fluid model base can be constructed to track all variations and related changes. Such a model base can be used to provide sufficiency and adaptation for formation fluid compositional analysis and, incorporated with other analytical models and simulation processes, can help to improve field data interpretation that matches constraints in hydrocarbon concentrations, geo-physics and/or petro-physics.

In most embodiments, an optical fluid model base includes data transformation (i.e., standardization) models and property predictive models that are calibrated on different sensors. To provide adequate flexibility for optical data processing and interpretation, an optical fluid model base may therefore include, but not be limited to, the following candidate constituents: transformation models calibrated on selected reference fluids through reverse transformation, transformation models calibrated on selected reference fluids through forward transformation, and predictive models calibrated on both Optical-Pressure, Volume, Temperature (PVT) database and sensor wheel data spaces.

Transformation model development requires matched calibration data pairs of optical sensor responses simulated in the Optical-PVT data space and measured in the sensor wheel data space. In Optical-PVT data space, diverse full-range fluid spectroscopies can be used in conjunction with separately measured system responses of optical elements to simulate optical sensor output. The simulated detector response on given fluid samples, however, is not exactly the same compared with directly-measured detector response from a sensor wheel or a real tool system due to the multiple influential factors, such as the variations in measurement conditioning and the mathematical approximation in simulation. Depending on the data space in which the fluid property predictive models are calibrated, data transformation models convert measured or simulated optical sensor output from one data space to another data space. FIG. 1 illustrates one such transformation.

FIG. 1 illustrates an embodiment of a general transformation model framework with a multi-input, multi-output neural network. The model that converts the actual sensor response channels (SW/Ch01-Ch0$n$) to the simulated Optical-PVT sensor response channels (PVT/Ch01-Ch0$n$) can be referred to as the reverse transformation model. The model that converts the sensor response to the simulated Optical-PVT sensor response can be referred to as the forward transformation model. Although the illustrated general transformation model framework in FIG. 1 is configured with multi-input/multi-output non-linear neural networks, there is no limitation to use other non-linear and linear transformation algorithms with single-input/single-output and multi-input/single-output configurations.

Figure 2:
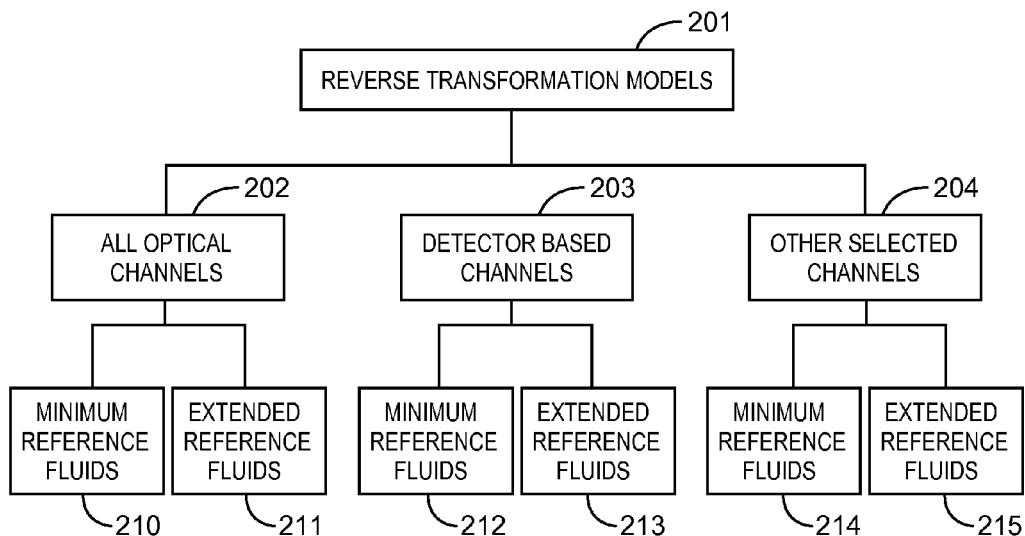
FIG. 2 illustrates an embodiment of a hierarchical structure for reverse transformation models.

Actual sensors may be implemented in the form of a sensor wheel that uses different optical elements installed in multiple rings, each ring comprising a detector type (e.g., a Thermopile detector, an Indium-Galium-Arsenide (InGaAs) detector, a Silicon (Si) detector). Other types of detectors may be used in some embodiments. Associated firmware/software and sensor gain settings may be different for each ring as well. The variations of transformation models (e.g., as illustrated in FIG. 2), can include: converting optical channels 202 for each sensor in a single model, converting the disjoined optical channels in several detector-based models 203, or converting only selected channels 204 of interest each time in different individual models. Compared to a single model implementation, multi-model options can improve the reliability of data construction in the output (i.e., transformed) parameter domain if one or more of the optical channels, as a transformation input, experience a problem.

FIG. 2 illustrates an embodiment of a hierarchical structure for reverse transformation models. The structure shows the reverse transformation models 201 over various types of channels: optical channels 202, detector-based channels 203, and other selected channels 204.

The reference fluid blocks 210-215, at the bottom of the hierarchical structure and coupled to the various channels 202-204, represent that the transformation models that can be built based on different reference fluids (e.g., minimum number of reference fluids 210, 212, 214 and extended reference fluids 211, 213, 215). The minimum number of reference fluids refer to the fluid samples of water, one medium oil, toluene, pentanediol, dodecane and nitrogen in one embodiment. These reference fluids are safe to use and easy to clean for testing purposes, and their optical sensor responses have a good coverage in data range as a representation of diverse fluids in an existing Optical-PVT database. Extended reference fluids often include one or more fluids such as oil and/or gas to make transformation model more robust.

Figure 3A:
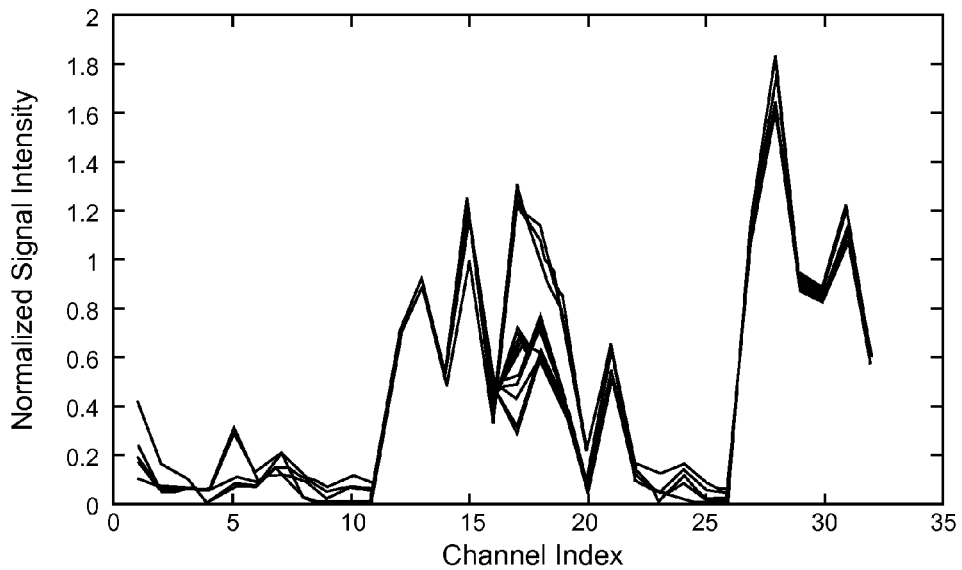
FIGS. 3A and 3B illustrate normalized optical signal intensity simulated with reference fluids and oil library fluids in an Optical-PVT database.
Figure 3B:
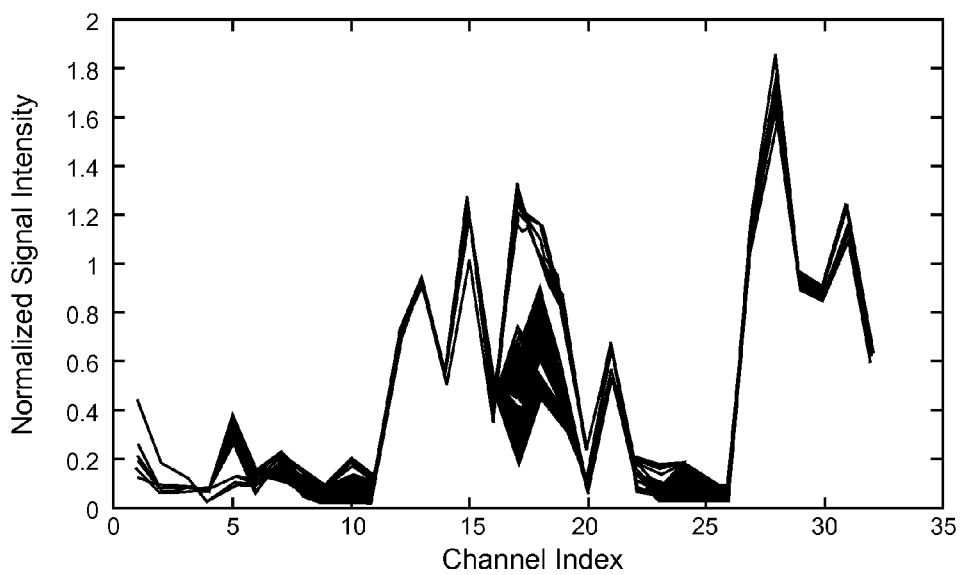

FIGS. 3A and 3B illustrate normalized optical signal intensity simulated with reference fluids (FIG. 3A) and global fluids in an Optical-PVT database (FIG. 3B). FIG. 3A illustrates profiles of optical responses on six reference fluids mentioned above over 32 sensor channels under different temperature and pressure setting points. FIG. 3B illustrates profiles of optical responses on 40 fluids in an Optical-PVT database simulated on the same sensor channels under the same testing conditions. The close match between envelope profiles confirms the potential of the mapping approach described herein, when the same calibration method, developed with the selected minimum number of reference fluids, is used in developing more robust transformation models that use extended reference fluids. This approach helps to reduce the risk of out-of-range transformations, and therefore improves model applicability for reliable data processing.

Reverse transformation models are designed to convert tool measurements into the Optical-PVT data space prior to applying predictive models calibrated on that data space. Forward transformation models can be used to convert a simulated optical sensor response of an Optical-PVT database to the sensor/tool domain prior to developing predictive models on that domain.

As seen in FIG. 1, a forward transformation model can be created by switching the input and the output of a neural network model. In other words, using an Optical-PVT synthetic-channel response as an input, and a measured sensor wheel channel response as an output. The neural network can then be retrained to calibrate forward transformation algorithms.

A hierarchical structure for the reverse transformation models, as illustrated in FIG. 2, can also be applied to forward transformation models. After the forward transformation model is developed, it can be used to convert the synthetic sensor responses of the global samples in the whole Optical-PVT database into the tool data space. Then the fluid property predictive models can be calibrated in tool data space, and the further transformation is not needed in field data processing because measured optical responses from the tool can be used as model inputs directly for fluid compositional analysis. Compared to the reverse transformation which applies on-line tool data conversion each time before making fluid prediction, forward transformation usually only applies one time off-line to convert Optical-PVT sensor responses for fluid prediction model development.

Figure 4A:
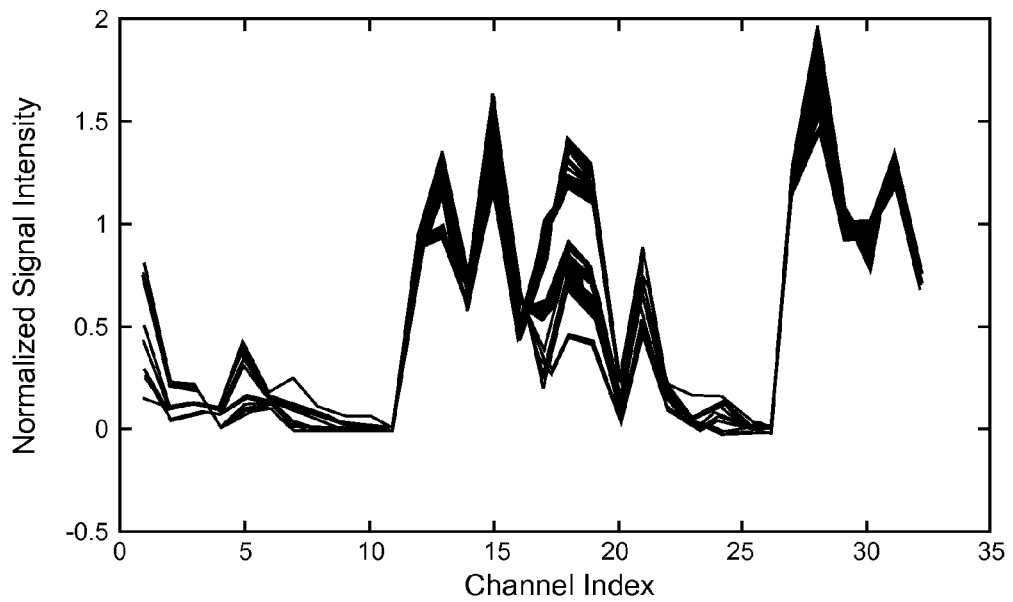
FIGS. 4A and 4B illustrate normalized optical signal intensity for reference fluids in sensor data space and transformed optical signal intensity on oil library fluids from Optical-PVT database to sensor data space through forward transformation.
Figure 4B:
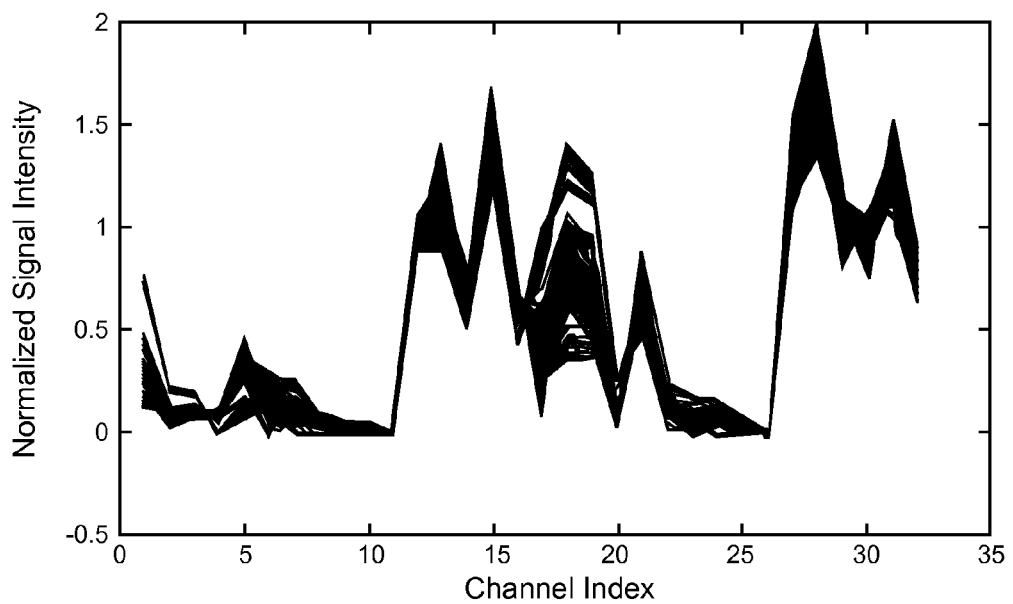

FIG. 4B illustrates transformed optical responses on 40 fluids in tool data space, using the same fluid responses in Optical-PVT database as transformation inputs are shown in FIG. 3B. The forward transformation model is calibrated on the same six reference fluids, using data shown in FIG. 3A as a training input and data shown in FIG. 4A as a training output. Note that forward transformation model is not used for processing the field data directly. After the fluid library data transformation is done, data processing only uses fluid prediction models calibrated with transformed inputs for sampling and testing analysis.

As described previously, transformation models can be calibrated over a small number of reference fluids for instrument standardization. The calibration fluids for predictive model development, however, use diversity to cover the dynamic range of the chemical or physical property of interest. Calibration fluids for asphaltene prediction, for example, may include non-asphaltene water, low-asphaltene light oil, high asphaltene heavy oil, and other fluid samples, such as live oil condensates and natural gas liquid to characterize property variations. Typically, a relatively large number of fluids from a standard oil database can be used to build the predictive models, and the use of different calibration data space can also improve flexibility and capability in providing multiple solutions. Pre-calibrated models that are calibrated over both the Optical-PVT and the sensor wheel data spaces can be used to predict multiple fluid properties, such as fluid compositional concentrations of methane, ethane, propane, saturates, aromatics, resins, asphaltenes, water, carbon dioxide, and other hydrocarbon parameters such as gas/oil ratio (GOR) and stock tank condition density (or API gravity).

Figure 5:
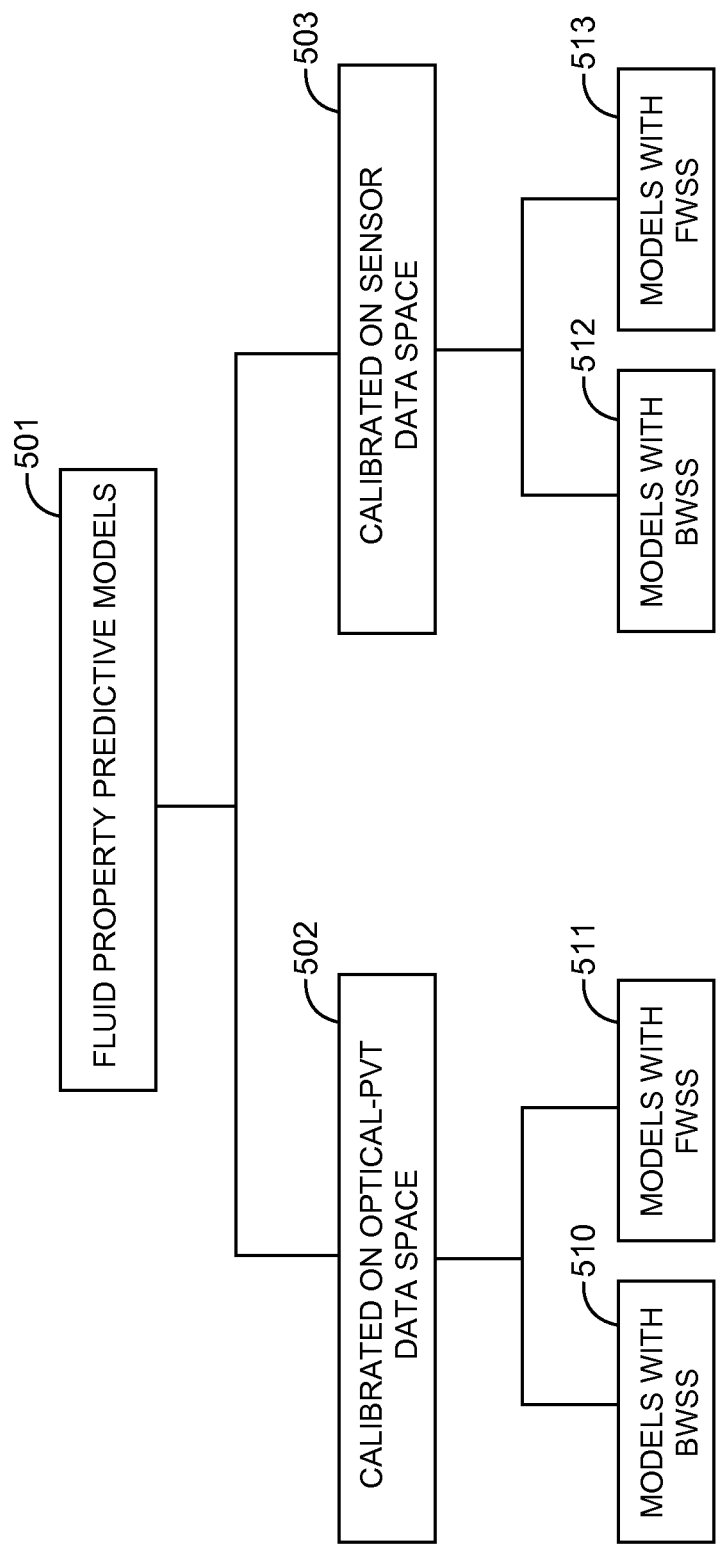
FIG. 5 illustrates an embodiment of a hierarchical structure of candidate models for fluid property prediction.

FIG. 5 illustrates an embodiment of a hierarchical structure of candidate models for fluid property prediction. The structure for the fluid property predictive models 501 includes models calibrated on Optical-PVT data space 502 and models calibrated on sensor data space 503. The models can include backward stepwise input selection (BWSS) models 510, 512 and forward stepwise input selection (FWSS) models 511, 513.

Each fluid property, also referred to in the art as an Answer Product, can be predicted in real time during a drilling operations, or post-processed with calibration models using optical sensor responses as inputs. An optical sensor may have multiple channels and each channel output can be the detector response through either a narrow-band filter or a multivariate optical element/integrated computational element, such as used in Halliburton's ICE Core™.

As an example, methane concentration predictive models can be calibrated using a different number of channel inputs as candidates. A first candidate model may use only five optical channel inputs. A second candidate model may use ten optical channel inputs. The model that performs best in calibration may not be the best for new data prediction due to a limitation of the existing calibration database that may contain only sparse fluid samples.

To reduce uncertainty in single model pre-selection, it is helpful to construct a candidate model base for each optical sensor in order to provide flexibility during data processing with all desired constraints (e.g., hydrocarbon concentrations, geo-physics and petro-physics) and prior knowledge applied.

Figure 6B:
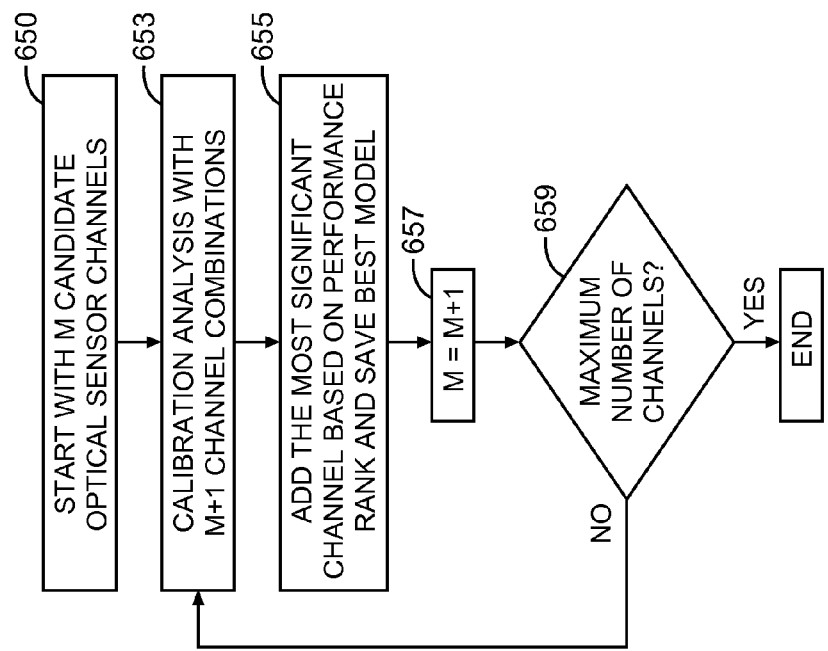
FIGS. 6A and 6B illustrate flowcharts of embodiments for backward and forward stepwise input selection as applied to model base construction for each answer product.
Figure 6A:
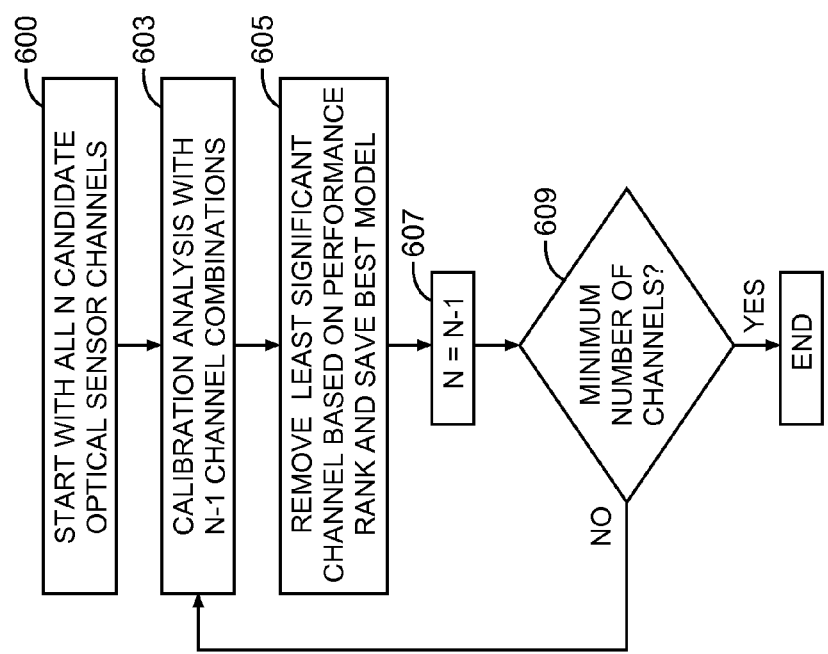

FIGS. 6A and 6B show flowcharts for embodiments of backward (FIG. 6A) and forward (FIG. 6B) stepwise input selection as applied to model base construction for each answer product in order to select optical channel inputs for each candidate model. The variables N and M refer to a number of channels of each optical sensor for FIGS. 6A and 6B, respectively, as will now be explained in detail.

Subsequent use of performance ranking can be determined by a network committee with three member networks to make fluid property predictions for each given set of inputs during input selection. Each member network is trained, validated and tested on different subsets of the calibration data, and the performance measure is the overall root of mean-squared error (RMS) averaged on the three member networks. The performance ranking is performed each time based on the overall RMS error over all possible combinations for the given number of inputs.

Referring to FIG. 6A, the backward stepwise input selection model starts with all N candidate optical sensor channels 600. A calibration analysis 603 with all possible J channel inputs, where J=N−1, is then performed. The least significant optical sensor channel from the calibration analysis, based on determining and ranking the calibration error for each J, is then removed from the N inputs and the best model associated with that optical sensor channel is saved 605 (where the best model is a model with the least significant channel removed from the N inputs). The quantity N is then decremented 607 by one and the new N is compared 609 to a threshold to determine if a minimum quantity of optical sensor channels has been reached. If this comparison is true, the process is done. If the comparison is false, the process repeats from the step of calibration analysis 603 with new N−1 optical sensor channel combinations. In other words, the backward stepwise input selection model repeats for N=J, until J=N−P channel inputs is reached, where N−P is a predetermined minimum number of channel inputs to be used for each optical sensor.

Referring to FIG. 6B, the forward stepwise input selection model starts with M initial primary candidate optical sensor channels 650, preselected from N channels. A calibration analysis 653 is performed on the M primary candidate channel inputs, with all possible J channel inputs, where J=M+1. The most significant optical sensor channel, based on determining and ranking the calibration error for each J, is then added to the M inputs and the best model with particular J inputs associated with that optical sensor channel is saved 655 (wherein the best model is a model with a most significant channel added to the M inputs). The quantity M is then incremented 657 by one and the new M is compared 659 to a threshold to determine if a maximum quantity of optical sensor channels has been reached. If this comparison is true, the process is done. If the comparison is false, the process repeats from the step of calibration analysis 653 with M+1 optical sensor channel combinations. In other words, the forward stepwise input selection model repeats for M=J until J=M+Q, where M+Q<=N is a predetermined maximum number of channel inputs to be used for each optical sensor.

The M initial primary candidate channel inputs can be pre-determined based on the multiple disciplines. For example, in predicting a particular hydrocarbon concentration or fluid property, the M initial primary optical channels should include at least one target integrated computational element channel designed for detecting that analyze or identifying that property.

Primary inputs to the models can also be combinational inputs from optical sensors and/or other sensors, including but not limited to: density, temperature, and/or pressure sensors that can be implemented in calibration measurement systems. Predictive models might be calibrated with inputs without density and then re-calibrated with density as an additional input. This approach may not only improve prediction when downhole density sensor data is available, but might also ensure improved prediction if the density sensor fails to operate properly.

In one embodiment of FWSS, the primary optical sensor inputs could be other selected inputs that might not be the best to fit the data generated by the calibration fluids. The primary optical sensor inputs might be less sensitive to multi-phase fluids, mixtures, or emulsions that are not present in the existing database. When such a complicated fluid type is encountered in field sampling and testing, using a less sensitive optical input might improve prediction reliability.

Evaluation that occur during calibration analyses are based on a robust neural network ensemble predictor with an ensemble output average over three member networks, trained, validated and tested on different data subsets of the calibration fluids.

Constructing an optical fluid model data base can provide flexibility for generating predictive matches under field constraints for field data post-processing and interpretation. In application, the optical fluid model base (including both candidate predictive models and transformation models) for each optical sensor can be used with a post-processing optimization routine in order to provide self-consistent solutions on fluid answer product prediction. The field data post-processing can be implemented with a genetic algorithm to evolutionarily optimize the predictive model selection of each fluid property by minimizing a multi-objective cost function, and provide integrated solutions. The multi-objective cost function may comprise a residual in calculating the estimated sum of constituent concentrations through sample compositional analysis, the number of inputs used for each fluid prediction model, the variation of prediction on primary properties at the selected sampling interval, and the mismatch between the model calculated primary properties and the expectation of the same properties from the prior knowledge.

Figure 7:
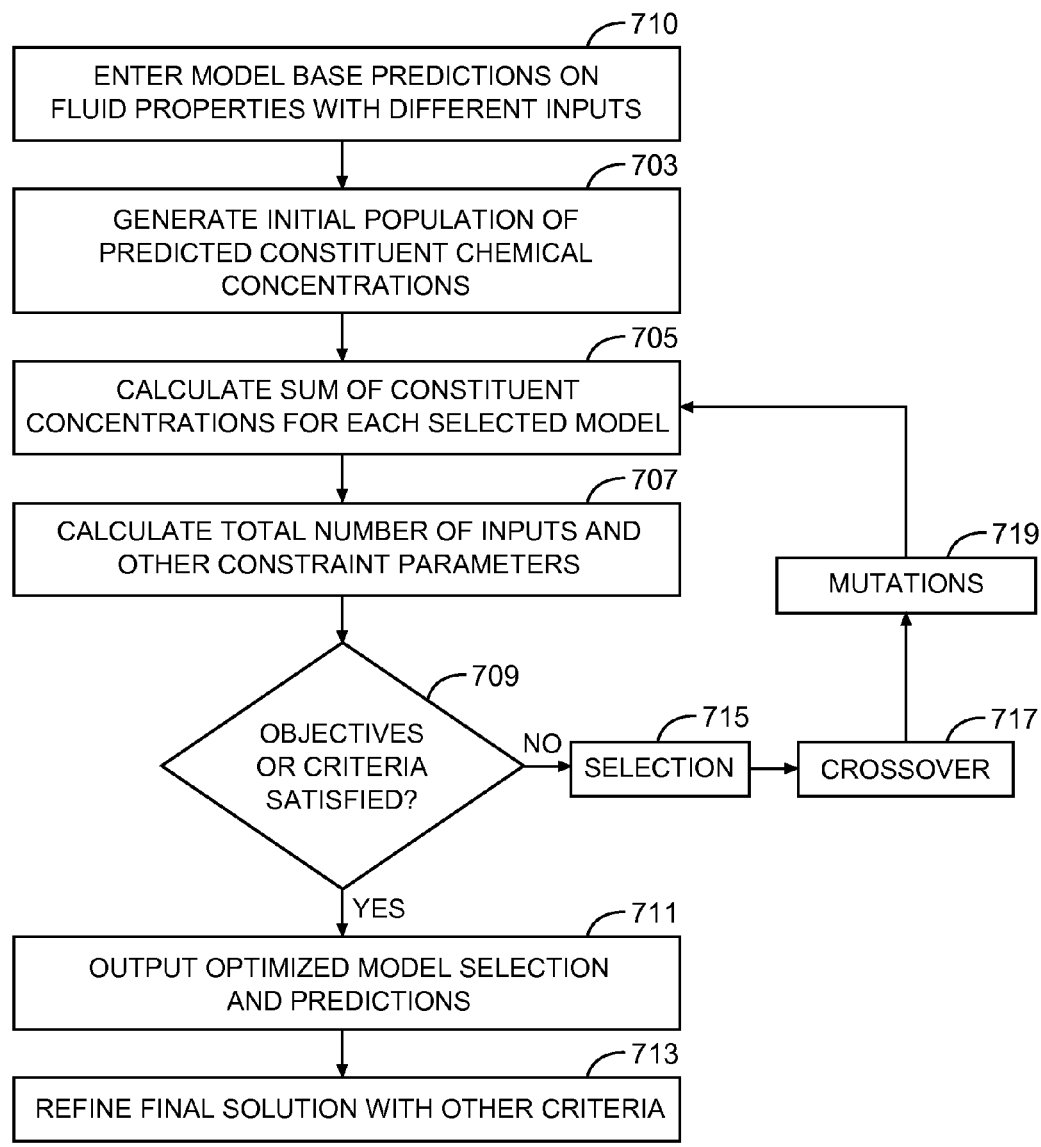
FIG. 7 illustrates a flowchart of an embodiment of a method for predictive model selection.

FIG. 7 illustrates a flowchart of an embodiment of a method for predictive model selection with post-processing. The prediction over a particular fluid property is evaluated with predictions over other fluid properties to determine which prediction can be adjusted by using constraints on fluid composition and other qualities.

The method begins by entering a set of model database predictions on fluid properties with different inputs 700. For the given set of the model database predictions for each fluid property, using candidate models from the model database with different inputs, the initial population of predicted constituent chemical concentrations is generated 703. The predictions can be saved as data maps with clarified model inputs as determined from the BWSS or FWSS methods discussed previously. The data maps can be constructed with predictions produced by Optical-PVT and/or sensor wheel based models. The initial population of predicted constituent chemical concentrations of fluid samples from the data maps can include $CH_4$ (methane), $C_2H_6$ (ethane), $C_3H_8$ (propane), $C_4H_{10}$ (butane), saturates, aromatics, resins, asphaltenes, $CO_2$, $H_2O$, or synthetic drilling fluid (SDF). The number of inputs for each concentration predictive model can be an optimization parameter during a refining step, as discussed below.

The sum of the constituent concentrations for each randomly selected model is calculated 705. The total number of prediction inputs and other constraint parameters for all composition predictive models is calculated 707. The sum can be normalized with the total maximum number of inputs. Additionally, quality prediction parameters, such as the standard deviation of each predictive model over the data range of interest, can be calculated. The result is compared to a measured fluid density if a densitometer is installed on the tool string. If the densitometer is not installed, a predicted fluid density using optical and other inputs can be used to determine when the objectives have been met and/or the selection criteria satisfied 709.

If the objectives have not been met or the selection criteria are not satisfied 709, multi-objective based performance measurement for each model selection realization in the initial population is ranked and the evolutionary optimization to minimize the multi-objection function with use of genetic operators such as selection 715, cross-over 717, and mutations 719, are performed through multiple generations.

If the objectives have been met and/or the selection criteria satisfied 709, the optimized model selection and predictions are determined and transmitted 711 to other parts of the process as needed. The final solution can then be refined using other criteria 713, by checking fluid bubble point, capacitance, and the simulated results with equation of states (EOS) for example. The solutions provided at the end of an optimization process can be selected predictive models that meet desired constraints.

Figure 8:
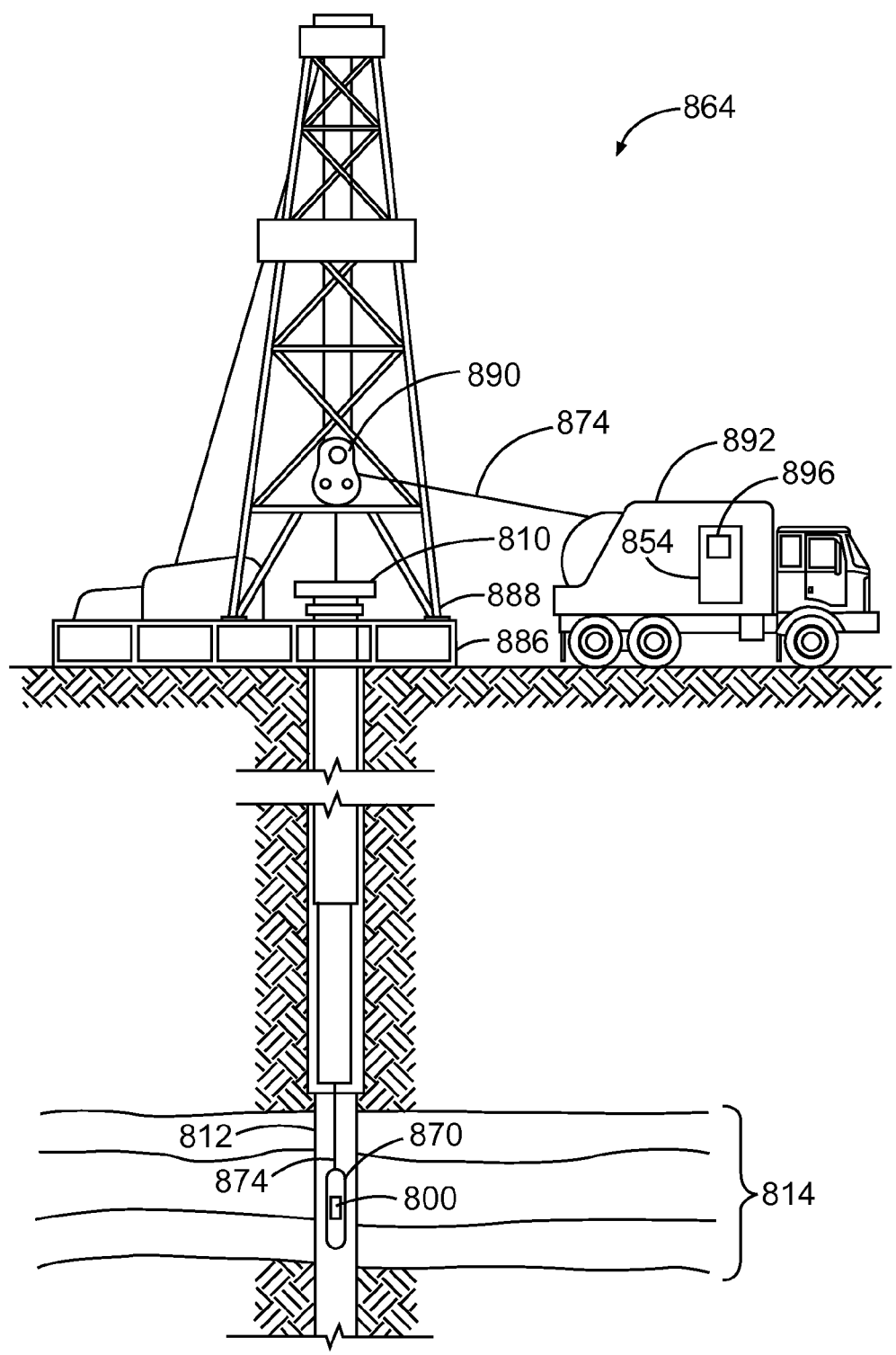
FIG. 8 illustrates a wireline system.
Figure 9:
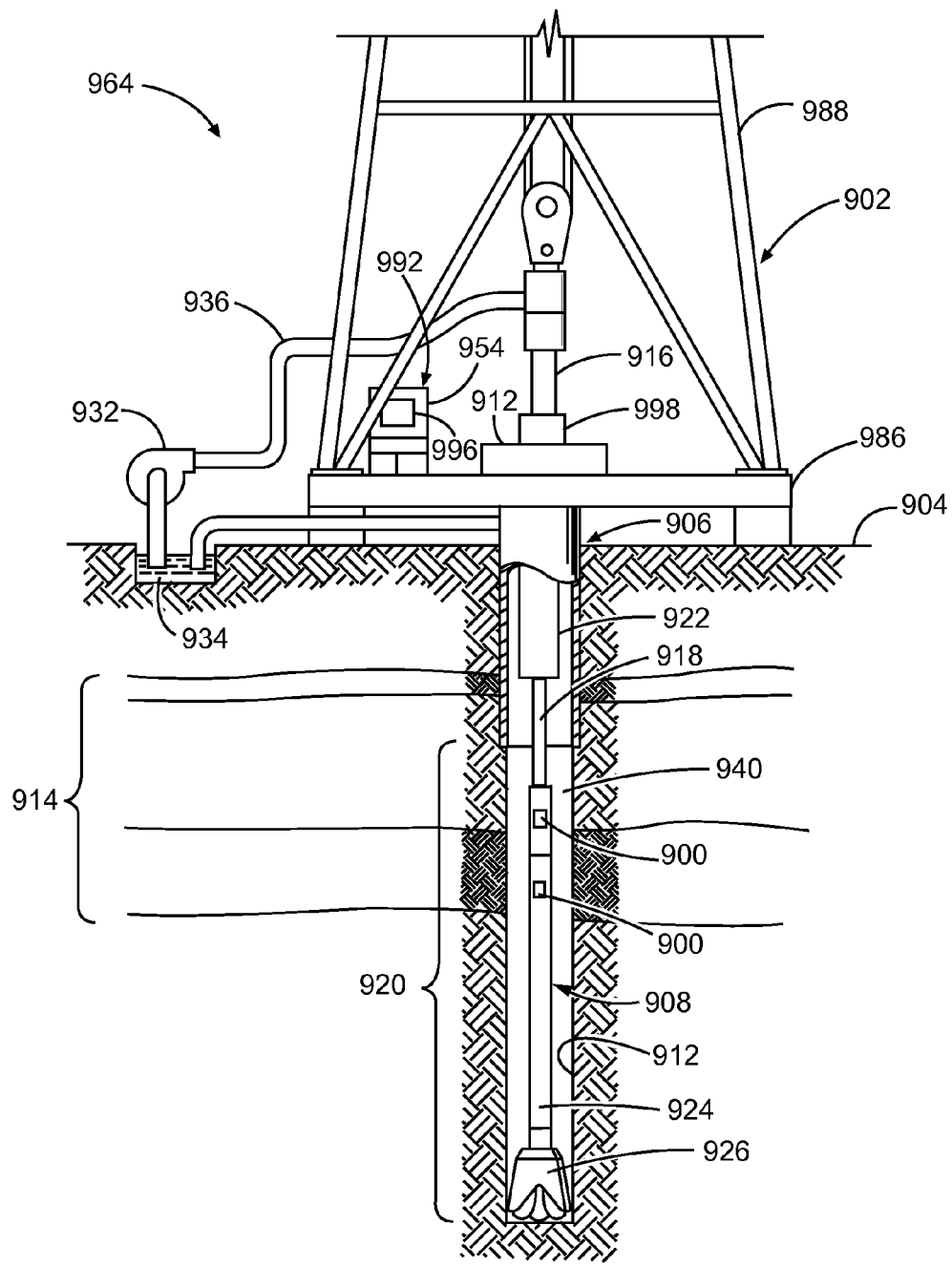
FIG. 9 illustrates a drilling rig system.

FIG. 8 illustrates a wireline system 864 embodiment. FIG. 9 illustrates a drilling rig system 964 embodiment. During a drilling operation of the well 912, as illustrated in FIG. 9, it may be desirable to know the types of formation fluids encountered.

The system 864 of FIG. 8 may comprise portions of a tool body 870 as part of a wireline logging operation that can include one or more multiple channel sensors 800, as described previously, as part of a downhole measurement tool. The system of FIG. 9 may comprise a downhole measurement tool 924, as part of a downhole drilling operation, that can also include one or more multiple channel sensors 900 as described previously.

FIG. 8 shows a drilling platform 886 that is equipped with a derrick 888 that supports a hoist 890. Drilling of oil and gas wells is commonly carried out using a string of drill pipes connected together so as to form a drilling string that is lowered through a rotary table 810 into a wellbore or borehole 812. Here it is assumed that the drilling string has been temporarily removed from the borehole 812 to allow a wireline logging tool body 870, such as a probe or sonde, to be lowered by wireline or logging cable 874 into the borehole 812. Typically, the tool body 870 is lowered to the bottom of the region of interest and subsequently pulled upward at a substantially constant speed.

During the drilling of the nearby ranging well, measurement data can be communicated to a surface logging facility 892 for storage, processing, and/or analysis. The logging facility 892 may be provided with electronic equipment 854, 896, including processors for various types of signal processing, which may be used by any one or more of the multiple channel sensors 800. Similar formation evaluation data may be gathered and analyzed during drilling operations (e.g., during LWD operations, and by extension, sampling while drilling).

FIG. 9 shows a system 964 that may also include a drilling rig 902 located at the surface 904 of a well 906. The drilling rig 902 may provide support for a drill string 908. The drill string 908 may operate to penetrate a rotary table for drilling a borehole 912 through subsurface formations 914. The drill string 908 may include a Kelly 916, drill pipe 918, and a bottom hole assembly 920, perhaps located at the lower portion of the drill pipe 918.

The bottom hole assembly 920 may include drill collars 922, a downhole tool 924, and a drill bit 926. The drill bit 926 may operate to create a borehole 912 by penetrating the surface 904 and subsurface formations 914. The downhole tool 924 may comprise any of a number of different types of tools including MWD (measurement while drilling) tools, LWD tools, and others.

During drilling operations, the drill string 908 (perhaps including the Kelly 916, the drill pipe 918, and the bottom hole assembly 920) may be rotated by the rotary table. In addition to, or alternatively, the bottom hole assembly 920 may also be rotated by a motor (e.g., a mud motor) that is located downhole. The drill collars 922 may be used to add weight to the drill bit 926. The drill collars 922 may also operate to stiffen the bottom hole assembly 920, allowing the bottom hole assembly 920 to transfer the added weight to the drill bit 926, and in turn, to assist the drill bit 926 in penetrating the surface 904 and subsurface formations 914.

During drilling operations, a mud pump 932 may pump drilling fluid (sometimes known by those of skill in the art as "drilling mud") from a mud pit 934 through a hose 936 into the drill pipe 918 and down to the drill bit 926. The drilling fluid can flow out from the drill bit 926 and be returned to the surface 904 through an annular area 940 between the drill pipe 918 and the sides of the borehole 912. The drilling fluid may then be returned to the mud pit 934, where such fluid is filtered. In some embodiments, the drilling fluid can be used to cool the drill bit 926, as well as to provide lubrication for the drill bit 926 during drilling operations. Additionally, the drilling fluid may be used to remove subsurface formation 914 cuttings created by operating the drill bit 926.

In some embodiments, the system 964 may include a display 996 to present fluid information and sensor responses as measured by the multiple channel sensors 900. This information can be used in steering the drill bit 926 during the drilling operation. The system 964 may also include computation logic, such as processors, perhaps as part of a surface logging facility 992, or a computer workstation 954, to receive signals from transmitters and receivers, and other instrumentation.

It should be understood that the apparatus and systems of various embodiments can be used in applications other than those described above. While the illustrations of systems 864, 964 provide a general description of the structure of various embodiments, other elements and features of apparatus and systems may be used with the structures described herein.

Figure 10:
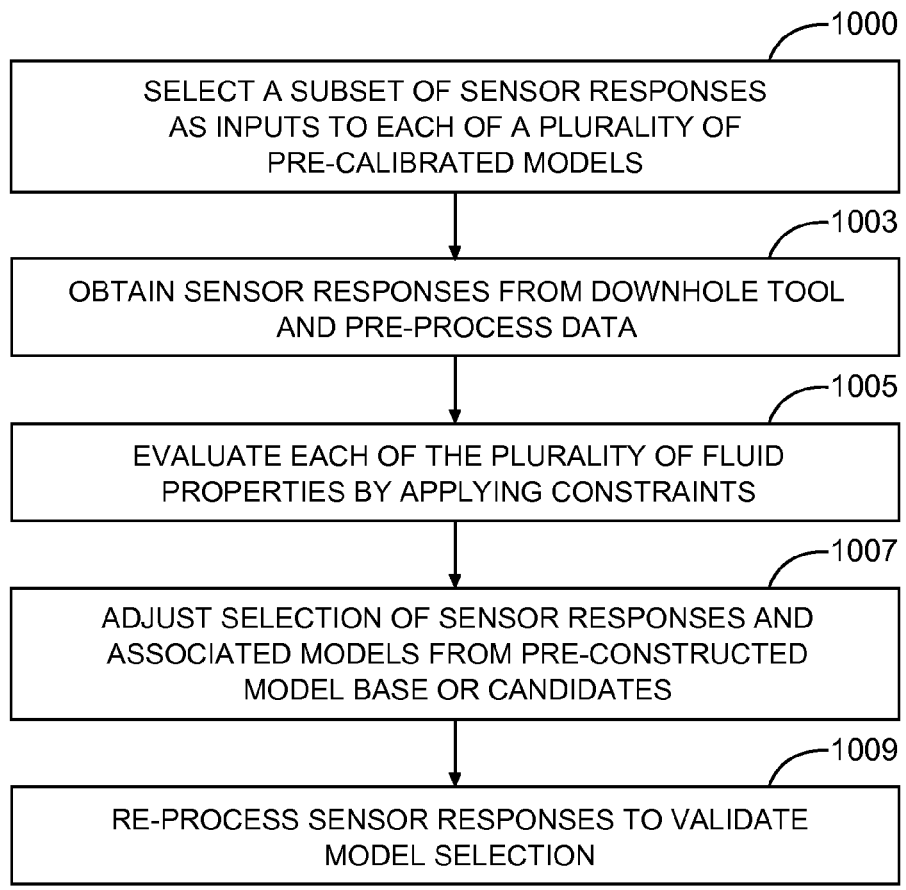
FIG. 10 illustrates a flowchart of an embodiment of a method for identifying formation fluid properties using sensor responses obtained from a downhole measurement tool.

FIG. 10 illustrates a flowchart of an embodiment of a method for identifying formation fluid properties using sensor responses obtained from a downhole measurement tool. A subset of the sensor responses are selected as inputs to each of a plurality of pre-calibrated models in predicting each of a plurality of formation fluid properties 1000. The sensor responses are obtained from the downhole measurement tool and preprocessed 1003. Each of the plurality of predicted formation fluid properties are evaluated by applying constraints 1005. The selection of sensor responses and the associated models are adjusted from a pre-constructed model base or candidates 1007. The sensor responses are reprocessed to validate model selection 1009.

Obtaining and pre-processing the sensor responses from the downhole measurement tool includes directing light to interact with the formation fluid in a wellbore. Light is directed to interact with the formation fluid in a wellbore to produce interacted light. The interacted light is transmitted as energy toward a plurality of narrow-band optical filters or multivariate optical element/integrated computational elements, such as used in Halliburton's ICE Core™. The detector responses are generated over the plurality of elements as sensor responses. After correcting baseline and normalizing the measured optical sensor responses, the normalized optical sensor responses are converted from a tool data space to a calibration data space.

Adjusting the selection of sensor responses and the associated models from a pre-constructed model base based on the initial data processing can include adjusting the sensor responses as inputs of instrument standardization models and/or fluid prediction models.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description and the figures, with each claim standing on its own as a separate embodiment.

What is claimed is:

1. A method for identifying formation fluid properties using optical sensor responses obtained from a downhole measurement tool, the method comprising:
   selecting a subset of the optical sensor responses as inputs to each of a plurality of pre-calibrated models in predicting each of a plurality of formation fluid properties;
   obtaining and pre-processing, by a processor, the subset of the optical sensor responses from a plurality of optical sensors of the downhole measurement tool;
   evaluating, by the processor, each of the plurality of predicted formation fluid properties by applying constraints;
   adjusting the selection of sensor responses and the associated models from a pre-constructed model base or candidates; and
   re-processing, by the processor, the optical sensor responses to validate model selection.

2. The method of claim 1 wherein selecting the subset of the optical sensor responses comprises pre-determining a set of detector outputs from the optical sensor as default input parameters to each of a plurality of pre-calibrated fluid prediction models.

3. The method of claim 1 wherein the pre-calibrated models used to predict the plurality of formation fluid properties comprises fluid compositional concentrations of methane, ethane, propane, saturates, aromatics, resins, asphaltenes, water, and carbon dioxide.

4. The method of claim 1 wherein obtaining and pre-processing the optical sensor responses from the downhole measurement tool comprises:
   directing light to interact with the formation fluid in a wellbore to produce interacted light;
   transmitting the interacted light as energy toward one or more narrow-band optical filters and one or more integrated computation elements of the optical sensor;
   generating detector responses over the plurality of elements as optical sensor responses, wherein the measured optical sensor responses are baseline corrected and normalized; and
   converting the normalized optical sensor responses from a tool data space to a calibration data space.

5. The method of claim 1 wherein evaluating the predicted fluid properties comprises:
   using pre-determined default parameters from the transformed optical sensor responses as inputs to predict the plurality of formation fluid properties; and
   applying other information from the tool string and simulation to validate each of the plurality of predicted formation fluid properties, wherein the other information comprises density sensor, capacitance sensor, bubble point calculated from an equation of states.

6. The method of claim 1 wherein adjusting the selection of sensor responses and the associated models comprises adjusting the sensor responses as inputs of instrument standardization models and/or fluid prediction models.

7. The method of claim 6 wherein a pre-constructed model base comprises the instrument standardization models calibrated with reverse transformation algorithms using sensor responses as inputs and synthetic sensor response as outputs, and forward transformation algorithms using synthetic optical responses as inputs and sensor response as outputs.

8. The method of claim 7 wherein a reverse transformation and/or forward transformation model is calibrated on a minimum number of reference fluids and/or extended number of reference fluids with linear single-input/single-output, and/or multi-input/single-output transformation algorithms.

9. The method of claim 7 wherein a reverse transformation and/or forward transformation model is calibrated on a minimum number of reference fluids and/or extended number of reference fluids with non-linear single-input/single-output, and/or multi-input/single-output, multi-input/multi-output transformation algorithms.

10. The method of claim 6 wherein a pre-constructed model base further comprises candidate fluid prediction models calibrated on an Optical-Pressure, Volume, Temperature (PVT) database and/or a transformed tool data space.

11. The method of claim 10 wherein the variable optical inputs of candidate fluid prediction models calibrated on a standard Optical-PVT database and/or a transformed tool data space are optimized through a linear and/or non-linear input selection algorithm.

12. The method of claim 11 wherein the linear and/or non-linear input selection algorithm is implemented with a backward stepwise input selection routine.

13. The method of claim 11 further comprising generating a plurality of candidate fluid prediction models with backward stepwise input selection for each sensor comprising:
performing, for N channel inputs, calibration analysis with all possible J channel inputs, where J=N−1;
determining and ranking a calibration error for each J;
saving a best model with particular J inputs, wherein the best model is a model with a least significant channel removed from the N inputs; and
repeat generating method for N=J until J=N−P, where N−P is a predetermined minimum number of channel inputs to be used for each optical sensor.

14. The method of claim 11 wherein the linear and/or non-linear input selection algorithm is implemented with a forward stepwise input selection routine.

15. The method of claim 14 further comprising generating a plurality of candidate fluid prediction models with forward stepwise input selection for each sensor comprising:
performing, for M primary candidate channel inputs pre-selected from N channels, calibration analysis with all possible J channel inputs, where J=M+1;
determining and ranking a calibration error for each J;
saving a best model with particular J inputs, wherein the best model is a model with a most significant channel added to the M inputs; and
repeating generating method for M=J until J=M+Q, where M+Q<=N is a predetermined maximum number of channel inputs to be used for each optical sensor.

16. The method of claim 15 wherein predetermined M primary channel inputs for predicting a particular hydrocarbon concentration or fluid property includes at least one target integrated computational element response designed for detecting that analyze or identifying that property.

17. The method of claim 1 wherein reprocessing the sensor responses to validate model selection comprises performing evolutionary optimization with use of a genetic algorithm to minimize a multi-objective cost function through multiple iterations.

18. The method of claim 17 wherein the multi-objective cost function comprises a residual in calculating an estimated sum of constituent concentrations through sample compositional analysis, a number of inputs used for each of fluid prediction models, a variation of prediction on primary properties at a selected sampling interval, and a mismatch between the model calculated primary properties and the expectation on the same properties from the prior knowledge.

19. An apparatus, comprising:
a platform attached to a set of sensors that each produce a plurality of channels of sensor responses; and
a processor programmed to:
select a subset of the plurality of channels of sensor responses, input the plurality of channels of sensor responses to each of a plurality of pre-calibrated models in predicting each particular formation fluid property, evaluate each predicted formation fluid property with other fluid properties by applying constraints, adjust the subset of the sensor response selections based on associated models from a pre-constructed model base or a candidate pool, and reprocess measurement data iteratively to validate model selection.

20. The apparatus of claim 19 further comprising a memory coupled to the processor, the memory comprising a database of optical sensor transformation models and optical sensor predictive models.

21. The apparatus of claim 20 wherein the memory further comprises a database of candidate models.

22. The apparatus of claim 19 wherein the set of sensors comprises:
an optical sensor wheel having a different optical element on some rings of a plurality of rings; and
a detector type associated with each of the plurality of rings.

23. The apparatus of claim 22 wherein the detector type comprises a thermopile detector, an Indium-Galium-Arsenide (InGaAs) detector, or a silicon detector.

24. The apparatus of claim 19 further comprising one of a drill string or a wireline coupled to a downhole tool attached to the platform, wherein the downhole tool comprises the set of sensors.

* * * * *